United States Patent

Affa

[11] Patent Number: 5,651,187
[45] Date of Patent: Jul. 29, 1997

[54] POSITION MEASURING DEVICE

[75] Inventor: Alfred Affa, Stein/Traun, Germany

[73] Assignee: Dr. Johannes Heidenhain GmbH, Traunreut, Germany

[21] Appl. No.: 514,259

[22] Filed: Aug. 11, 1995

[30] Foreign Application Priority Data

Aug. 12, 1994 [DE] Germany .................. 44 28 590.6

[51] Int. Cl.⁶ .................................................. G01B 11/02
[52] U.S. Cl. .................................................. 33/706
[58] Field of Search .................. 33/706, 708, 707; 250/237 G

[56] References Cited

U.S. PATENT DOCUMENTS

| | | | |
|---|---|---|---|
| 3,973,119 | 8/1976 | Renes et al. ............ | 250/237 G |
| 3,981,106 | 9/1976 | Stutz . | |
| 4,101,764 | 7/1978 | Nelle . | |
| 4,363,964 | 12/1982 | Schmitt . | |
| 4,628,609 | 12/1986 | Rieder et al. ............ | 33/707 |
| 4,654,527 | 3/1987 | Schmitt ................. | 33/707 |
| 4,793,067 | 12/1988 | Reimar et al. . | |
| 4,999,623 | 3/1991 | Affa . | |
| 5,007,177 | 4/1991 | Rieder et al. ............ | 33/706 |
| 5,010,655 | 4/1991 | Rieder et al. ............ | 33/707 |
| 5,115,573 | 5/1992 | Rieder et al. ............ | 33/706 |
| 5,251,012 | 10/1993 | Riegger et al. .......... | 33/707 |

FOREIGN PATENT DOCUMENTS

| | | |
|---|---|---|
| 0246404 | 11/1987 | European Pat. Off. . |
| 2416212 | 11/1974 | Germany . |
| 2540412C3 | 3/1977 | Germany . |
| 3914739 | 11/1990 | Germany . |
| 40 37 545 | 5/1992 | Germany . |
| 4243778A1 | 6/1994 | Germany . |
| 4244178A1 | 7/1994 | Germany . |

*Primary Examiner*—G. Bradley Bennett
*Attorney, Agent, or Firm*—Brinks Hofer Gilson & Lione

[57] ABSTRACT

A position measuring system in which a scale has a reference mark track with two different sequences of reference marks are provided adjacent to an incremental division track. A first sequence of reference marks are disposed at successively different intervals and a second sequence of reference marks are disposed at equal intervals. Two modes of operation are available where either the absolute position is determined by scanning either the first sequence of reference marks or the second sequence of reference marks.

11 Claims, 5 Drawing Sheets

A1

B1

POSITION MEASURING DEVICE

BACKGROUND OF THE INVENTION

The invention relates to a position measuring instrument and, more particularly, to a position measuring instrument having two sequences of different reference marks extending in parallel to an incremental division track.

Measuring instruments of this kind are used particularly in machine tools to measure the relative location of a tool. They are also used in coordinate measuring machines to ascertain the location and size of test specimens.

The electrical pulses generated at the reference marks can be used for reproducing reference positions in the counter, for approaching a certain position at the beginning of a measurement or after interruptions, for monitoring and correcting the counter state, and for acting upon a control unit on the output side.

For ascertaining the reference positions in incremental measuring instruments, two fundamental principles are known. By the first principle, a row of identical reference marks is applied at fixed intervals parallel to the incremental division. A switch means is assigned to each reference mark that is intended to become operative in the measuring operation. The electrical outputs of the switch means and of the scanner element for the reference marks are connected to an evaluation unit, which outputs a control pulse to the counter only whenever an electrical signal is present simultaneously both at the scanner element of the reference mark and at the switch means. The result of the control pulse is that a predetermined counter value is set in the counter. A measuring instrument of this kind is disclosed in U.S. Pat. Nos. 4,101,764 and 4,363,964 which are hereby specifically incorporated herein.

By the second principle, at least one reference mark track with identical reference marks is disposed, again parallel to the incremental division. Each reference mark is spaced apart from another reference mark by a special interval that characterizes the reference mark. These different intervals between reference marks are determined by scanning the incremental division by means of counting the measuring steps (increments). One such measuring instrument is known from U.S. Pat. No. 3,982,106 which is hereby specifically incorporated herein. In U.S. Pat. No. 4,793,067 which is hereby specifically incorporated herein two successive intervals between reference marks are used to determine the absolute value of a reference mark.

In German Patent Disclosure DE 42 43 778 A1, a position measuring instrument is again described in which an incremental division is provided to form counting signals, and a further track is provided to determine the absolute position. This further track, in an exemplary embodiment, comprises a sequence of identical reference marks at different intervals, so that the various reference mark positions can be distinguished from one another by the characteristic spacing between two successive reference marks. In another exemplary embodiment, the further track comprises markings, which form a sequential code for generating position-determining code words.

The attempt has already been made to create measuring instruments in which both principles are combined in a single position measuring instrument. One of these measuring instruments is described in U.S. Pat. No. 4,999,623 which is hereby specifically incorporated herein. Parallel to the incremental track, there is a reference mark track in which only identical reference marks are disposed, at successive different intervals. By counting out the increments from one reference mark to the next, the absolute position of these marks is determined. A further track has a row of markings that are disposed at equal intervals. To make a selection of reference marks, these markings are assigned to certain reference marks. From these markings in turn, one can be selected, as a result of which only the reference mark assigned to it is made to become operative. A mode selector toggle switch is also provided, with which the evaluation of all the reference marks by the principle of interval coding, or only the evaluation of the marked reference marks, is enabled.

The disadvantage of this position measuring instrument is that to select reference marks spaced apart by equal intervals, one additional track is needed, as well as a third track for further selection of one of the markings. Moreover, the markings must be assigned precisely to the reference marks, which requires expensive adjustment work. Another disadvantage is that when the lengths to be measured are great, successive reference marks must have a large interval between them, if different intervals over the entire measurement length are to be attained. The shortest possible interval between markings in the second track corresponds, however, to the greatest interval between reference marks, so that the reference marks selected by means of the markings have an overly long interval for actual practice if the second measurement principle is to be employed.

To overcome this last disadvantage, German Patent Disclosure DE 42 44 178 A1 provides at least two tracks that have reference marks. This has the disadvantage that a relatively large amount of space must be available next to the incremental division, and that the scanning unit is very wide.

An object of the present invention is to reduce production and storage costs and to assure broad utility by making the position measuring instrument uniform, and at the same time to attain a low structural height of the position measuring instrument.

Advantages of the invention are that the position measuring instrument can be adapted to the requirements of the user and nevertheless have a low structural height.

SUMMARY OF THE INVENTION

According to a first aspect of the present invention a position measuring system is provided. The position measuring system includes a scale and a scanner unit. The scale has at least one incremental division track with at least one incremental division and at least one reference mark track. The reference mark track has a first sequence of identical reference marks which are disposed at different intervals along the reference mark track so that each reference mark of the first sequence of reference marks can be distinguished by characteristic intervals. The reference mark track also has a second sequence of reference marks. The first sequence of reference marks are different from the second sequence of reference marks. The scanner unit is positioned to scan the scale and generate counting signals when the scanner unit scans the incremental division track and generate a first reference mark signal when the scanner unit scans the first sequence of reference marks and a second reference signal when the scanner unit scans the second sequence of reference marks.

The invention itself, together with further objects and attendant advantages, will best be understood by reference to the following detailed description, taken in conjunction with the accompanying drawings.

DETAILED DESCRIPTION OF THE PRESENTLY PREFERRED EMBODIMENTS

Figure 1:
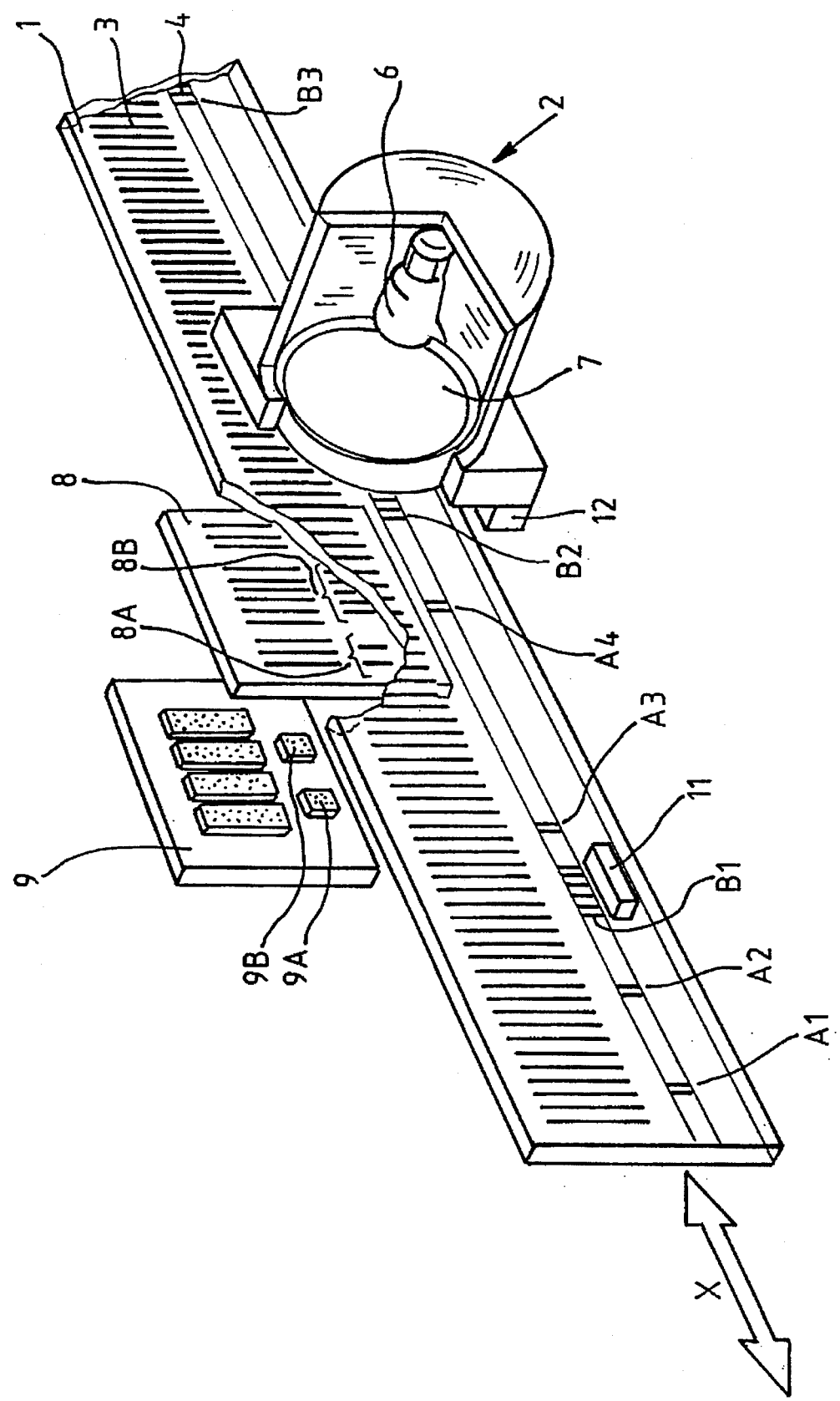
FIG. 1, a photoelectric incremental length measuring instrument according to a first preferred embodiment of the present invention.

FIG. 1 illustrates a photoelectric incremental length measuring instrument having a scale 1 and a scanner unit 2. The scale 1 is displaceable in the measurement direction X relative to the scanning unit 2. The scale 1 has an incremental division disposed in an incremental division track and a number of reference marks A1–A9 and B1–B8 are disposed in a reference mark track 4. The scanning unit 2 is provided for photoelectric scanning of the incremental division track 3 and the reference mark track 4. The scanning unit 2 includes a light source 6, a collimator lens 7, a scanner plate 8 and a photoelectric receiver array 9. The scale 1 is mounted on a first object (not shown) and the scanning unit 2 is mounted on a second object (not shown) movable with respect to the first object.

In a preferred embodiment, the incremental division track 3 and the reference mark track 4 are formed by a series of opaque lines and transparent gaps. Alternatively, they may be formed by non-reflective lines and reflective gaps. If the incremental division track 3 and the reference mark track 4 are formed by a series of opaque lines and transparent gaps, the scanning plate 8 and photoelectric receiver array 9 are located behind the scale 1 as illustrated. If the incremental division track 3 and reference mark track 4 are formed by a series of non-reflective lines and reflective gaps, the scanner plate 8 and photoelectric receiver array 9 are located on the same side of the scale 1 as the light source 6. The scanner plate 8 also has a plurality of transparent regions. In the preferred embodiment illustrated, the light emitted from the light source 6 passes through the transparent regions on the scale 1 and scanner plate 8 to strike the photoelectric receiver array 9.

Figure 2:
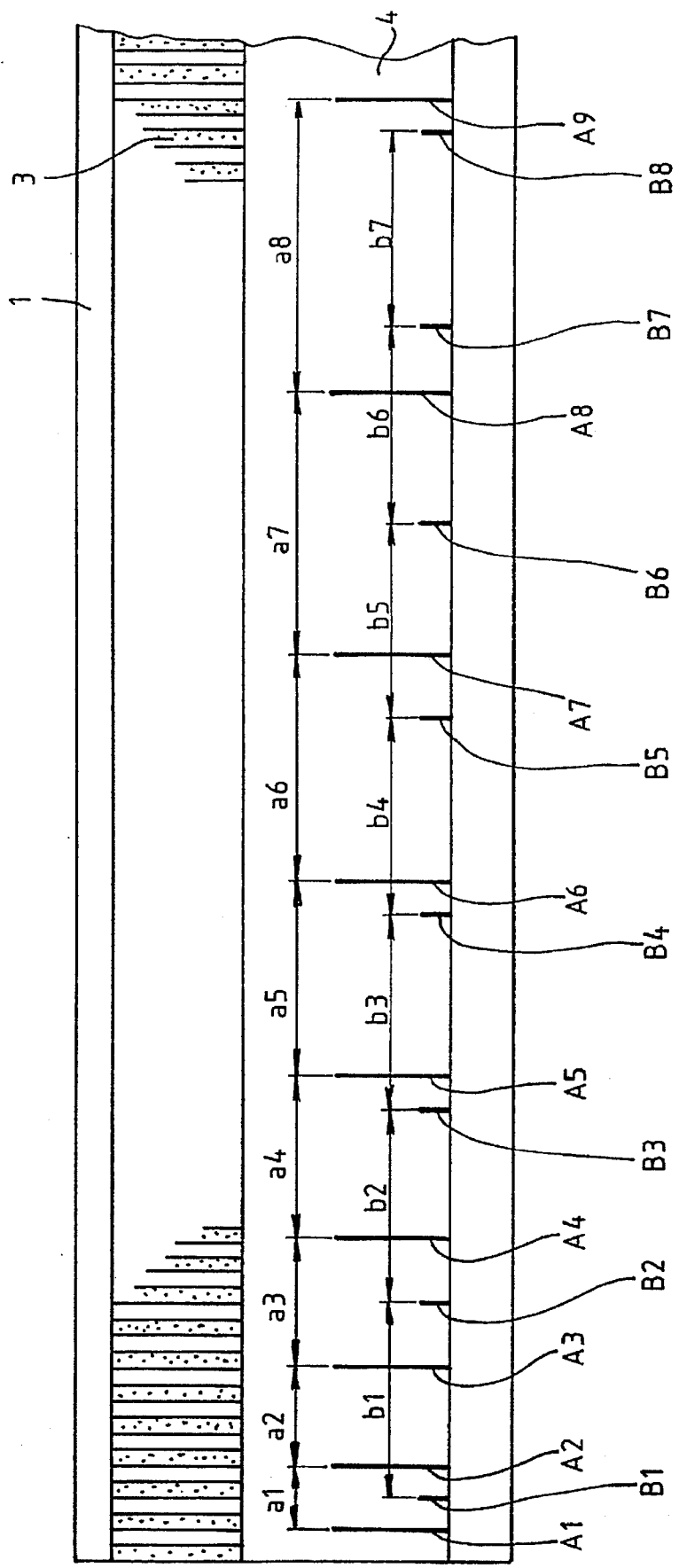
FIG. 2 is an enlarged view of a portion of the scale of the length measuring instrument shown in FIG. 1.

FIG. 2 is an exploded view of a portion of the scale 1 shown in FIG. 1. The incremental division track 3 has a plurality of opaque lines and transparent gaps of equal width. The reference mark track 4 extends parallel with the incremental division track 3. The reference mark track 4 includes two sequences of reference marks, A1–A9 and B1–B8, respectively.

As the scanner unit 2 scans the incremental division track 3 on the scale 1, periodic analog electrical signals are generated, from which rectangular signals, countable by triggering and hereinafter called counting signals, are formed in a known manner and thus need not be described in further detail. The first sequence of identical reference marks A1–A9 is provided at successively different intervals a1–a8. The second sequence of identical reference marks B1–B8 is applied at successively identical intervals b1–b7. In a preferred embodiment, the intervals b1–b7 are about 50 mm. For illustration purposes, to distinguish the two sequences of reference marks A1–A9 and B1–B8, they are represented in FIG. 2 by lines of different heights. In actuality, each individual reference marks A1–A9 and B1–B8 comprises a combination of opaque lines and transparent gaps, which extends over a plurality of increments of the incremental division track 3.

Figure 3:
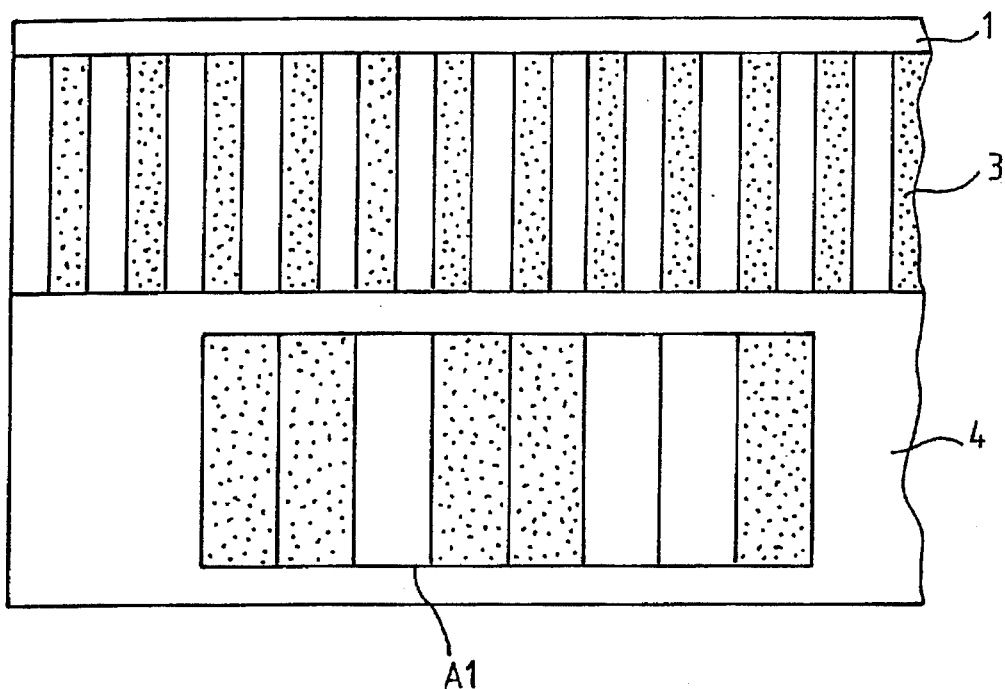
FIG. 3 illustrates in detail a portion of the scale shown in FIG. 2 illustrating a reference mark from a first sequence of reference marks.
Figure 4:
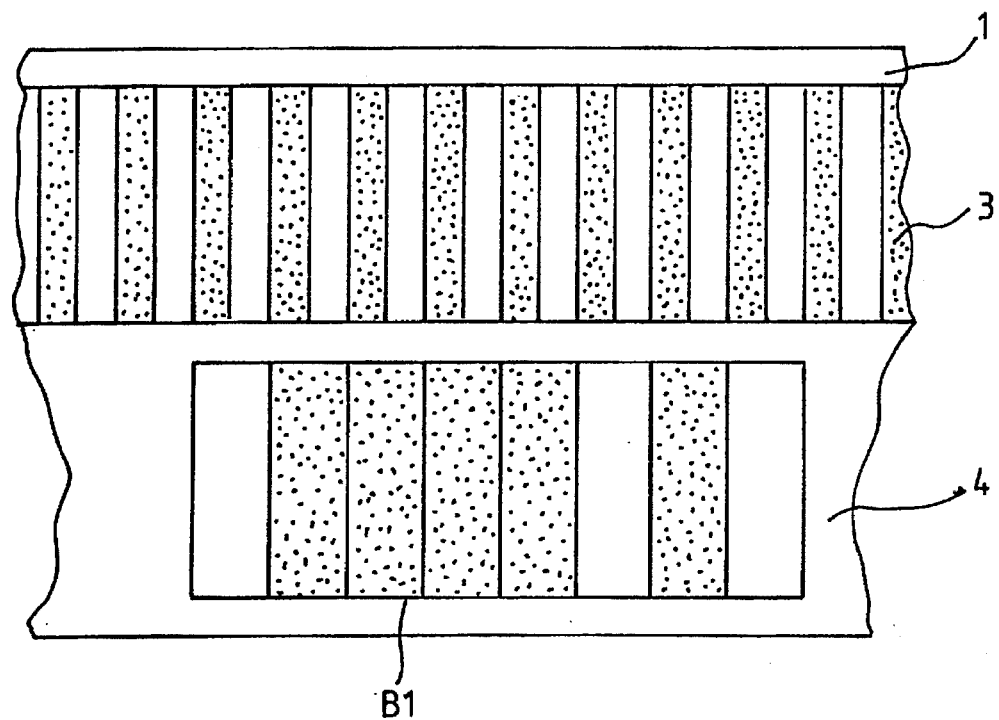
FIG. 4 illustrates in detail a portion of the scale shown in FIG. 2 illustrating a reference mark from a second sequence reference marks.

FIG. 3 is an exploded view of a portion of the scale shown in FIG. 2 illustrating a reference mark A1. FIG. 4 is an exploded view of a portion of the scale shown in FIG. 2 illustrating a reference mark B1. In actual practice, these reference marks A1, B1 extend not over merely eight increments of the incremental division track 3 but rather over a great number of them, such as approximately 70. By a skilled combination of the opaque lines and transparent gaps of one reference mark A1, B1, narrow reference marks pulse RA, RB are created, centered on an incremental counting pulse.

Figure 5:
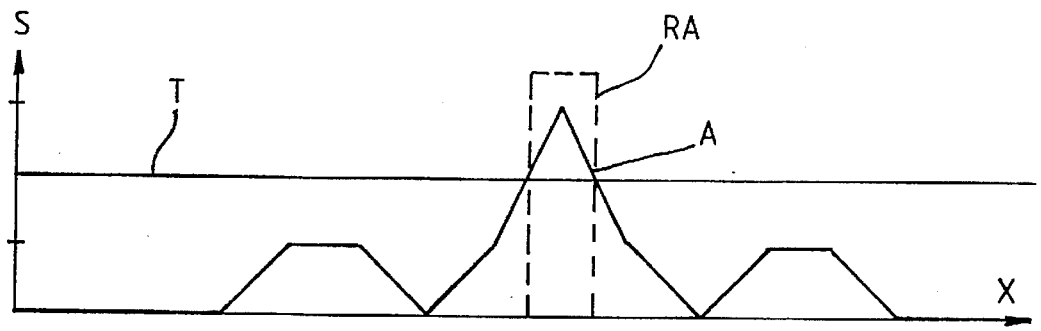
FIG. 5 illustrates a signal diagram for a first reference pulse.
Figure 6:
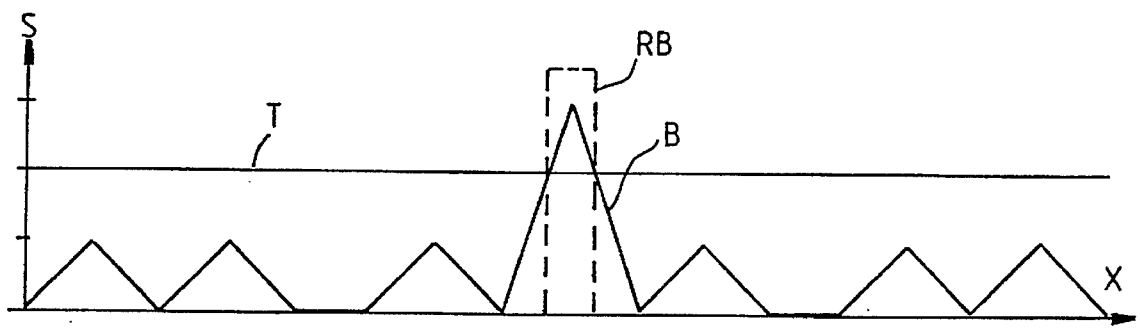
FIG. 6 illustrates a second signal diagram for a second reference pulse.
Figure 7:
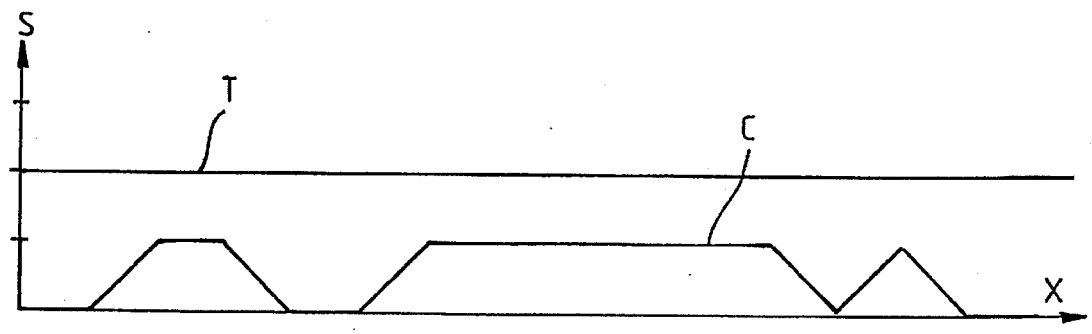
FIG. 7 illustrates a third signal diagram.

For scanning the reference marks A1–A9 and B1–B8, two scanning fields 8A, 8B, respectively, are provided on the scanner plate 8 of the scanning unit 2. The scanning field 8A has a distribution of lines and gaps like the reference marks A1–A9. The line-gap distribution of scanning field 8B is equivalent to the line-gap distribution of the reference marks B1–B8. In scanning of each reference mark A1–A9 with the scanning field 8A, a signal A of amplitude S, which is shown in FIG. 5, is generated in the associated receiving field 9A. In the scanning of each reference mark B1–B8 with the scanning field 8B, a signal B, shown in FIG. 6, is generated in the associated receiving field 9B. By triggering of the signals A and B, one reference mark pulse RA and RB respectively having a width corresponding approximately to one increment of the incremental division track 3, is generated. Since the two sequences of reference marks A1–A9 and B1–B8 are disposed in a single track 4, nested in one another, it is essential that the reference marks A1–A9 and B1–B8 be embodied such that no reference pulse RB or RA be generated when the reference marks A1–A9 are scanned by means of the scanning field 8B, or when the reference marks B1–B8 are scanned by means of the scanning field 8A. In both of these cases, as shown in FIG. 7, the level S of the signal C generated by the corresponding receiving fields 9B, 9A is below the trigger signal level T required for forming a reference pulse RB or RA.

Figure 8:
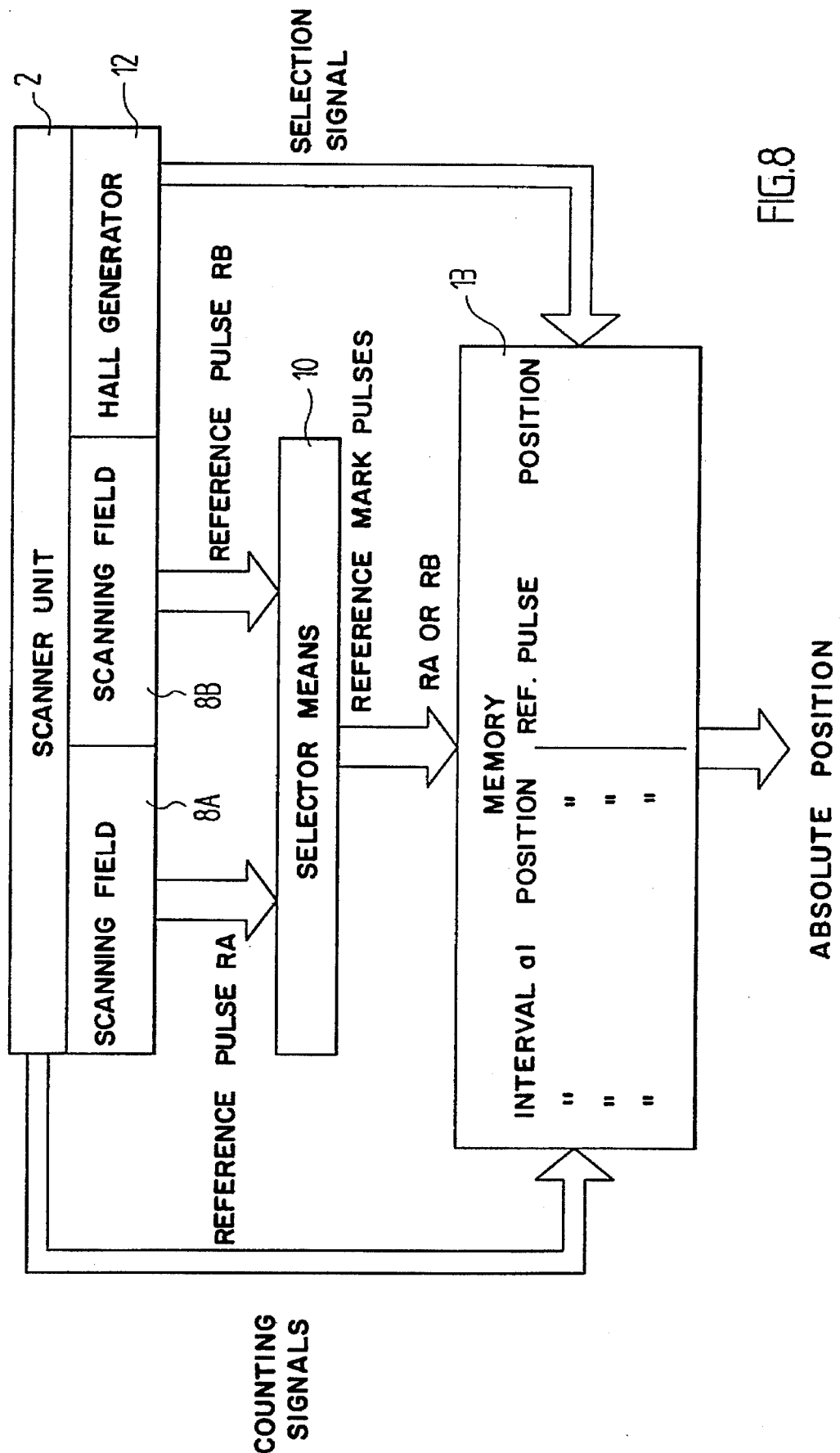
FIG. 8 is a block diagram illustrating the operation of the measuring instrument according to a preferred embodiment of the present invention.

As a result of this advantageous embodiment of the scale 1, it is possible for the user himself to select between two modes. FIG. 8 illustrates schematically the position measuring system which includes the scanner unit 2, a Hall generator 12 which will be described hereinafter, a selector 10 and an evaluation unit 13. The evaluation unit 13 has memory for storing information. In the first mode of operation, only the first sequence of reference marks A1–A9 will be evaluated because the selector 10 only allows the reference pulse RA to be delivered to the evaluation unit 13. In a known manner, by counting the increments between two successive reference marks A1–A9, one absolute position is unequivocally assigned to each reference mark A1–A9. To that end, one absolute position is stored in a memory region of the evaluation unit 13 for each interval a1–a8. The assignment of an absolute position can also be done by means of a plurality of intervals a1–a8, as described in U.S. Pat. No. 4,793,067 which is hereby specifically incorporated herein.

In the second mode, only the second succession of reference marks B1–B8, spaced apart by identical intervals, will be evaluated, in a manner known (see U.S. Pat. Nos. 4,101,764 and 4,363,964). Once again, the incremental division 3 is scanned in order to generate counting signals.

A magnet 11 is disposed on the scale 1 and assigned to a particular reference mark from the reference marks B1–B8. A Hall sensor 12 is disposed on the scanner unit 2. When the Hall sensor 12 passes over the magnet 11 the Hall sensor 12 generates a selection signal which is delivered to the evaluation unit 13. Only when both the selection signal and reference mark pulse RB appear simultaneously is an absolute position output. When this selected reference mark is detected, the counter state of the position indicator device is set to a predetermined value. As schematically shown in FIG. 8, a memory region is provided for that purpose in the evaluation unit 13, and the absolute position assigned to that reference mark B1 is stored in that region.

Instead of the absolute position, it is also possible for only a control signal to be fed to a position indicator unit, or for a numerical control to be provided.

To switch over between the two modes described, the selector means 10 is provided. This selector means 10 is preferably embodied as a reversing switch on the scanner unit 2 or the position indicator unit, so that either the reference mark pulses RA or RB will be supplied to the evaluation unit 13. However, it is also within the scope of the invention for the mode already to be selected at the manufacturer, for instance by soldering a specific connection in the scanner unit 2. The selection can equally well be made by covering up the unused receiving field 9a or 9b or the unused scanning field 8a or 8b. Screens actuatable from outside can also be used for that purpose. A further option for mode selection is to use a scanner plate 8 with only one scanning field 8a or 8b and/or one receiver 9 with only one receiving field 9a or 9b.

The invention can also be successfully used in angle measuring instruments. Moreover, it is not limited to the photoelectric scanning principle but can also be used for instance in magnetic measuring instruments.

Of course, it should be understood that a wide range of changes and modifications can be made to the preferred embodiment described above. It is therefore intended that the foregoing detailed description be regarded as illustrative rather than limiting and that it be understood that it is the following claims, including all equivalents, which are intended to define the scope of this invention.

What is claimed is:

1. A position measuring instrument comprising:
    a scale having at least one incremental division track and one reference mark track, wherein the reference mark track has a sequence of identical first reference marks located at different intervals along the scale and the reference mark track has a second reference mark track of evenly spaced second reference marks which differ from the sequence of first reference marks; and
    either a first scanner unit that can be positioned to scan the incremental division track and generate counting signals and to scan the reference mark track and generate reference mark pulses, the first scanner unit having a first scanning field which is designed so that in the course of scanning the sequence of first reference marks, a first reference mark pulse is generated at each of the first reference marks, and in the course of scanning the second reference mark, no reference mark pulse is generated wherein an absolute position is assigned to the respective reference mark pulses in that the different characteristic intervals between the first reference marks are determined by an evaluation of the counting signals of the incremental division track between the reference mark pulses; or
    a second scanner unit that can be positioned to scan the incremental division track, the second scanner unit having a second scanning field which is designed so that in the course of scanning the sequence of second reference marks a second reference mark pulse is generated at each one of the second reference marks, and in the course of scanning the first reference mark no reference mark pulses are generated.

2. A position measuring instrument according to claim 1 further comprising a selector assigned to at least one of the second reference marks wherein the selector is scanned and an absolute position of the position measuring instrument is determined with respect to the selector.

3. A position measuring instrument according to claim 1, wherein the first and second reference marks are differently designed.

4. A position measuring instrument according to claim 1, wherein each first reference mark and each second reference mark consists of a pattern of lines disposed next to each other in the measuring direction, the pattern of the lines of the first reference marks differs from the pattern of the lines of the second reference marks and the first scanning field of the scanner unit has a pattern of lines which is identical with the pattern of the first reference marks and the second scanning field has a pattern of lines which is identical with the pattern of the second reference marks.

5. A position measuring instrument according to claim 2, wherein the selector is a magnet which is scanned by a Hall generator of the scanner unit.

6. A position measuring instrument comprising:
    a scanner unit having a first scanning field and a second scanning field; and
    either a first scale having at least one incremental division track which is scanned by the scanner unit to form counting signals and a first reference mark track with a sequence of identical first reference marks spaced at different intervals from each other which is also scanned by the scanner unit, whereby the first scanning field is designed so that scanning the sequence of first reference marks, a first reference mark pulse is generated at each of the first reference marks and the second scanning field is designed so that scanning the sequence of first reference marks, no reference mark pulses are generated and an absolute position is assigned to the reference mark pulses in that the different characteristic intervals between the first reference marks are determined by an evaluation of the counting signals of the incremental division track between the reference mark pulses; or
    a second scale having at least one incremental division track which is scanned by the scanner unit to form counting signals and a second reference mark track with a sequence of identical second reference marks spaced at identical intervals which is also scanned by the scanner unit, whereby the first scanning field is designed so that scanning the sequence of second reference marks no reference mark pulses are generated and the second scanning field is designed so that scanning the sequence of second reference marks, a second reference mark pulse is generated at each of the second reference marks.

7. A position measuring instrument according to claim 6, wherein each first reference mark and each second reference mark consists of a pattern of lines disposed next to each other in the measuring direction; the pattern of the lines of the first reference marks differs from the pattern of the lines of the second reference marks, the first scanning field has a pattern of lines which is identical with the pattern of the first reference mark, and the second scanning field has a pattern of lines which is identical with the pattern of the second reference mark.

8. A position measuring instrument comprising:

at least one incremental division track which is scanned by a scanner unit for forming counting signals and one reference mark track, the reference mark track having a first sequence of identical first reference marks which are disposed at different intervals in the first reference track so that these reference marks can be distinguished by characteristic intervals between a plurality of reference marks of this sequence, the same reference track also having a second sequence of identical second reference marks disposed in successive identical intervals, the reference marks of the first sequence being different than the reference marks of the second sequence;

the scanner unit having a first scanning field which is designed such that in the course of scanning the sequence of first reference marks a reference mark pulse is generated at each of these reference marks, and in the course of scanning the second reference mark no reference mark pulse is generated, the scanner unit also having a second scanning field which is designed such that in the course of scanning the sequence of second reference marks a reference mark pulse is generated at each of these reference marks and in the course of scanning the first reference mark no reference mark pulse is generated; and means for selecting whether the position measuring instrument is operated in a first or second mode of operation wherein in the first mode the first scanning field scans the scale and the reference pulses from the first sequence of first reference marks are supplied to an evaluation unit which ascertains the absolute position of one first reference mark from the characteristic intervals obtained by counting signals between first reference marks and in the second mode the second scanning field scans the scale and reference mark pulses from the second sequence of second reference marks are supplied to the evaluation unit which ascertains the absolute position of one of the second reference mark.

9. A position measuring instrument according to claim 8 wherein the first and second sequence of reference marks are formed by a like gap distribution of a row of successive opaque lines and transparent gaps which are scanned photoelectrically by the scanner unit, the scanner unit further comprising a first scanning field with a line-gap distribution identical to the first sequence of reference marks and a second scanning field with a line-gap distribution identical to the second scanning field, the line-gap distribution of the second sequence of reference marks being different from the line-gap distribution of the first sequence of reference marks so that when the first sequence of reference marks is scanned by the second scanning field and the second sequence of reference marks is scanned by the first scanning field, no reference pulse is generated.

10. A position measuring instrument according to claim 8, wherein said means for selecting is an electric reversing switch mounted on the position measuring instrument.

11. A position measuring instrument according to claim 8, wherein said means for selecting is a covering, which is provided in the beam path between said light source and a first receiving field assigned to said first scanning field, or in the beam path between said light source and a second receiving field assigned to said scanning field.

* * * * *

UNITED STATES PATENT AND TRADEMARK OFFICE
CERTIFICATE OF CORRECTION

PATENT NO. :     5,651,187
DATED      :     July 29, 1997
INVENTOR(S) :    Alfred Affa It is certified that error appears in the above-indentified patent and that said Letters Patent is hereby corrected as shown below:

On the Title Page

In column 1, line 2, under "U.S. PATENT DOCUMENTS", change "3,981,106" to --3,982,106--.

Signed and Sealed this

Twenty-eighth Day of December, 1999

Attest:

Q. TODD DICKINSON

Attesting Officer     Acting Commissioner of Patents and Trademarks